(12) United States Patent
Jee et al.

(10) Patent No.: US 12,568,837 B2
(45) Date of Patent: Mar. 3, 2026

(54) SEMICONDUCTOR CHIP, SEMICONDUCTOR PACKAGE INCLUDING THE SAME, AND METHOD OF FABRICATING THE SAME

(71) Applicant: SAMSUNG ELECTRONICS CO., LTD., Suwon-si (KR)

(72) Inventors: Young Kun Jee, Suwon-si (KR); Jihwan Hwang, Suwon-si (KR); Chungsun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 543 days.

(21) Appl. No.: 18/120,826

(22) Filed: Mar. 13, 2023

(65) Prior Publication Data

US 2024/0071942 A1     Feb. 29, 2024

(30) Foreign Application Priority Data

Aug. 26, 2022     (KR) ........................ 10-2022-0107917

(51) Int. Cl.
*H01L 23/538*     (2006.01)
*H01L 23/00*      (2006.01)

(52) U.S. Cl.
CPC ...... *H01L 23/5386* (2013.01); *H01L 23/5384* (2013.01); *H01L 24/06* (2013.01); *H01L 2224/06051* (2013.01); *H01L 2224/06102* (2013.01); *H01L 2224/08146* (2013.01)

(58) Field of Classification Search
CPC ............. H01L 23/5386; H01L 23/5384; H01L 23/481; H01L 25/0657; H01L 25/50; H01L 24/06; H01L 24/05; H01L 24/08; H01L 24/09
See application file for complete search history.

(56) References Cited

U.S. PATENT DOCUMENTS

| | | | |
|---|---|---|---|
| 9,887,182 B2 | 2/2018 | Chen et al. | |
| 10,777,534 B2 | 9/2020 | Huang et al. | |
| 11,063,008 B2 | 7/2021 | Lin et al. | |
| 11,094,613 B2 | 8/2021 | Hu et al. | |
| 11,217,563 B2 | 1/2022 | Zhai | |
| 2012/0292746 A1* | 11/2012 | Lee ................... | H01L 21/76898 |
| | | | 257/621 |

(Continued)

*Primary Examiner* — Zandra V Smith
*Assistant Examiner* — John M Parker
(74) *Attorney, Agent, or Firm* — Sughrue Mion, PLLC

(57) ABSTRACT

A semiconductor chip including a semiconductor substrate having first and second surfaces, a transistor on the first surface, a first interlayer dielectric layer on the transistor, a second interlayer dielectric layer on the first interlayer dielectric layer, a wiring line in the second interlayer dielectric layer, a first conductive pad on the second interlayer dielectric layer, a first passivation layer on the second interlayer dielectric layer, a second conductive pad in the first passivation layer, a through via penetrating the semiconductor substrate and the first interlayer dielectric layer to come into connection with the wiring line, a second passivation layer on the second surface, and a third conductive pad in the second passivation layer and connected to the through via. The first passivation layer has a first thickness 0.4 to 0.6 times a second thickness between the first surface and a top surface of the second passivation layer.

20 Claims, 21 Drawing Sheets

(56)     References Cited

U.S. PATENT DOCUMENTS

| | | | | |
|---|---|---|---|---|
| 2018/0197826 A1* | 7/2018 | Wu | ....................... | H01L 23/145 |
| 2018/0358328 A1* | 12/2018 | Kang | .................. | H01L 25/0657 |
| 2020/0365593 A1 | 11/2020 | Chen et al. | | |
| 2020/0411445 A1* | 12/2020 | Chen | ................... | H01L 23/5383 |
| 2021/0143116 A1* | 5/2021 | Hong | .................. | H01L 25/0657 |
| 2021/0375781 A1* | 12/2021 | Lin | ....................... | H01L 23/544 |
| 2021/0375819 A1 | 12/2021 | Chen et al. | | |
| 2022/0278058 A1* | 9/2022 | Kuo | ....................... | H01Q 21/28 |
| 2023/0005859 A1* | 1/2023 | Chen | ....................... | H01L 25/18 |
| 2023/0197760 A1* | 6/2023 | Chiou | ................... | H10B 20/65 |
| | | | | 257/431 |

* cited by examiner

TVL
TSV

STI  TR

CT  107  105 VA

MD

TE2
PL2
101a
110
101
101b
IMD
PL1

1b
1
1a
3
9

19 33 27  35 13  7  11 5 15

SEMICONDUCTOR CHIP, SEMICONDUCTOR PACKAGE INCLUDING THE SAME, AND METHOD OF FABRICATING THE SAME

CROSS-REFERENCE TO RELATED APPLICATION

This claims priority to Korean Patent Application No. 10-2022-0107917, filed on Aug. 26, 2022, in the Korean Intellectual Property Office, the disclosure of which is hereby incorporated by reference herein in its entirety.

BACKGROUND

The disclosure relates to a semiconductor chip, a semiconductor package including the semiconductor chip, and a method of fabricating the same.

A semiconductor package is provided to implement an integrated circuit chip for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

Some embodiments provide a semiconductor chip with increased reliability, a semiconductor package with increased reliability, or a semiconductor chip fabrication method capable of increasing a yield.

According to an aspect of an embodiment, a semiconductor chip, includes: a semiconductor substrate having a first surface and a second surface that are opposite to each other; at least on transistor on the first surface; a first interlayer dielectric layer on the transistor; a second interlayer dielectric layer on the first interlayer dielectric layer; at least one wiring line in the second interlayer dielectric layer; a first conductive pad on the second interlayer dielectric layer; a first passivation layer on the second interlayer dielectric layer and the first conductive pad; a second conductive pad in the first passivation layer and connected to the first conductive pad; a through via that penetrates the semiconductor substrate and the first interlayer dielectric layer and connects with the wiring line; a second passivation layer on the second surface; and a third conductive pad in the second passivation layer and connected to the through via, wherein the first passivation layer has a first thickness, and wherein the first thickness is from about 0.4 times to about 0.6 times a second thickness between the first surface and a top surface of the second passivation layer.

According to an aspect of an embodiment, a semiconductor chip, includes: a first sub-chip and a second sub-chip bonded to the first sub-chip, wherein each of the first sub-chip and the second sub-chip includes: a semiconductor substrate having a first surface and a second surface that are opposite to each other; at least one transistor on the first surface; a first interlayer dielectric layer on the transistor; a second interlayer dielectric layer on the first interlayer dielectric layer; at least one wiring line in the second interlayer dielectric layer; a first conductive pad on the second interlayer dielectric layer; a first passivation layer on the second interlayer dielectric layer and the first conductive pad; a second conductive pad in the first passivation layer and connected to the first conductive pad; a through via that penetrates the semiconductor substrate and the first interlayer dielectric layer to connect with the wiring line; a second passivation layer on the second surface; and a third conductive pad disposed in the second passivation layer and connected to the through via, wherein the first passivation layer of the first sub-chip contacts the first passivation layer of the second sub-chip, and wherein the second conductive pad of the first sub-chip contacts the second conductive pad of the second sub-chip.

According to an aspect of an embodiment, a semiconductor package, includes: a buffer die; a plurality of semiconductor chips stacked on the buffer die; and a mold layer on a top surface of the buffer die and lateral surfaces of the plurality of semiconductor chips, wherein each of the plurality of semiconductor chips comprises: a first wiring section comprising multi-layered wiring lines; a lower connection structure below the first wiring section, the lower connection structure comprising a lower via and a lower conductive pad; and an upper connection structure on the first wiring section, the upper connection structure comprising an upper via and an upper conductive pad, wherein the first wiring section is at a level the same as a level of a center of the semiconductor chip, wherein a bottom surface of the lower conductive pad is at a level the same as a level of a bottom surface of the semiconductor chip, and wherein a top surface of the upper connection structure is at a level the same as a level of a top surface of the semiconductor chip.

According to an aspect of an embodiment, a method of fabricating a semiconductor chip includes: forming a through via in a semiconductor substrate having a first surface and a second surface opposite to the first surface; forming multi-layered wiring lines and a first interlayer dielectric layer on the first surface, the first interlayer dielectric layer on the wiring lines; forming a first conductive pad on the first interlayer dielectric layer; forming a first passivation layer on the first conductive pad and the first interlayer dielectric layer; etching the first passivation layer to form a first trench that exposes the first conductive pad and has a stepped inner sidewall; forming a second conductive pad that fills the first trench; exposing the through via by removing a portion of the semiconductor substrate adjacent to the second surface; forming a second passivation layer on the second surface; and forming a third conductive pad in the second passivation layer, the third conductive pad connected to the through via.

According to an aspect of an embodiment, a method of fabricating a semiconductor chip includes: preparing a first wafer structure and a second wafer structure, each of the first wafer structure and the second wafer structure comprising: a semiconductor substrate, a through via formed in the semiconductor substrate, a first interlayer dielectric layer on the through via and the semiconductor substrate, wiring lines stacked in the first interlayer dielectric layer, a first passivation layer on the first interlayer dielectric layer, and a first conductive pad in the first passivation layer; the method further comprising, bonding the second wafer structure to the first wafer structure, the first passivation layer and the first conductive pad of the second wafer structure correspondingly contacting the first passivation layer and the first conductive pad of the first wafer structure; removing a portion of the semiconductor substrate of the second wafer structure to expose the through via of the second wafer structure; forming a second passivation layer and a second conductive pad on the semiconductor substrate of the second wafer structure; removing a portion of the semiconductor substrate of the first wafer structure to expose the through via of the first wafer structure; and forming a third passivation layer and a third conductive pad on the semiconductor substrate of the first wafer structure.

BRIEF DESCRIPTION OF DRAWINGS

The above and other aspects and features will be more apparent from the following description of example embodiments, taken in conjunction with the accompanying drawings, in which:

FIG. 6 illustrates a cross-sectional view showing a semiconductor package according to example embodiments.

DETAILED DESCRIPTION OF EMBODIMENTS

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIGS. 1A to 1E illustrate cross-sectional views showing a semiconductor chip according to various embodiments.

Figure 1A:
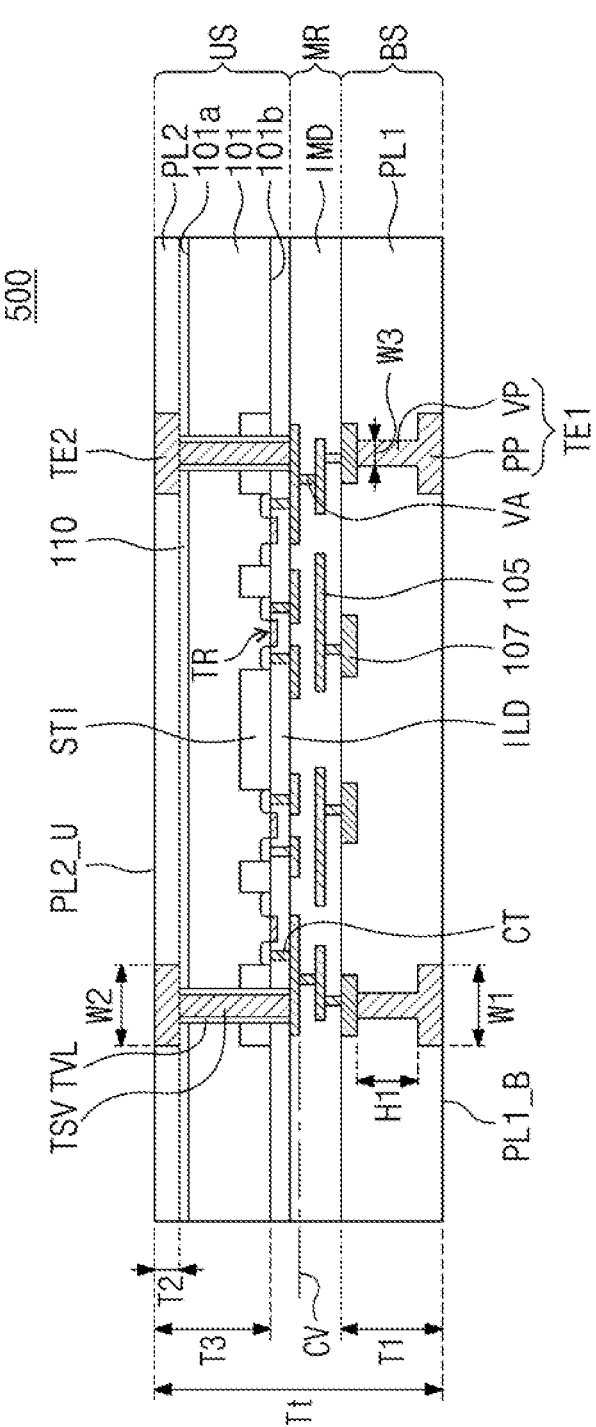
FIGS. 1A to 1E illustrate cross-sectional views showing a semiconductor chip according to example embodiments.

Referring to FIG. 1A, a semiconductor chip 500 according to the present embodiment may include a semiconductor substrate 101. The semiconductor substrate 101 may include, for example, a semiconductor material. The semiconductor substrate 101 may be a monocrystalline silicon substrate. The semiconductor substrate 101 may have a first surface 101*a* and a second surface 101*b* that are opposite to each other. The second surface 101*b* may be provided thereon with a device isolation layer STI that defines active regions. Transistors TR may be disposed on the active regions. The semiconductor substrate 101 may be provided with capacitors or memory cells on the second surface 101*b* thereof.

A first interlayer dielectric layer ILD may be disposed on the transistors TR and the second surface 101*b*, for example, to insulate the transistor TR. According to an embodiment, the transistor TR and the second surface 101*b* may be covered with the first interlayer dielectric layer ILD. The first interlayer dielectric layer ILD may have a single-layered or multi-layered structure of at least one selected from silicon oxide, silicon nitride, silicon oxynitride, and porous dielectrics. The first interlayer dielectric layer ILD may be provided therein with contacts CT connected with the transistors TR. Each of the transistors TR may include a gate electrode, a gate dielectric layer, and source/drain regions.

A second interlayer dielectric layer IMD may be on a bottom surface of the first interlayer dielectric layer ILD. For example, the bottom surface of the first interlayer dielectric layer ILD may be covered with the second interlayer dielectric layer IMD. The second interlayer dielectric layer IMD may have a single-layered or multi-layered structure of at least one selected from silicon oxide, silicon nitride, silicon oxynitride, and porous dielectrics. The second interlayer dielectric layer IMD may have a mechanical strength less than that of the first interlayer dielectric layer ILD.

The second interlayer dielectric layer IMD may be provided therein with multi-layered wiring lines 105. Each of the wiring lines 105 may include at least one metal selected from copper, tungsten, aluminum, titanium, titanium nitride, and tungsten nitride. The second interlayer dielectric layer IMD may be provided therein with internal vias VA connected to the wiring lines 105. A wiring section MR may be constituted by the second interlayer dielectric layer IMD, the internal vias VA, and the wiring lines 105. The internal vias VA may include a conductive material that is the same as that of the wiring lines 105.

First conductive pads 107 may be disposed below the second interlayer dielectric layer IMD. The first conductive pads 107 may be formed of a metal, such as, for example, aluminum. A first passivation layer PL1 may be formed on bottom surfaces of the first conductive pads 107 and a bottom surface of the second interlayer dielectric layer IMD. For example, the first passivation layer PL1 may cover the bottom surfaces of the first conductive pads 107 and the bottom surface of the second interlayer dielectric layer IMD. The first passivation layer PL1 may have a single-layered or multi-layered structure including at least one selected from silicon oxide, silicon nitride, silicon oxynitride, and silicon carbonitride.

Second conductive pads TE1 may be disposed in the first passivation layer PL1. The second conductive pads TE1 may include a metal, such as, for example, copper. Each of the second conductive pads TE1 may include a via part VP and a pad part PP that are integrally connected into a single unitary piece. The second conductive pads TE1 may each have a T-shape cross section. A bottom surface of the pad part PP may be coplanar with a bottom surface PL1_B of the first passivation layer PL1. A lower connection structure BS may include the first conductive pads 107, the second conductive pads TE1, and the first passivation layer PL1. The first conductive pads 107 may be called internal conductive pads. The second conductive pads TE1 may be called lower conductive pads.

A protection layer 110 and a second passivation layer PL2 may be formed on the first surface 101*a* of the semiconductor substrate 101. For example, the first surface 101*a* of the semiconductor substrate 101 may be covered with the protection layer 110 and the second passivation layer PL2. The protection layer 110 may have a single-layered or multi-layered structure including least one selected from, for example, silicon oxide and silicon nitride. The second passivation layer PL2 may have a single-layered or multi-layered structure including at least one selected from silicon oxide, silicon nitride, silicon oxynitride, and silicon carbonitride.

A through via TSV may penetrate the protection layer 110, the semiconductor substrate 101, the device isolation layer STI, and the first interlayer dielectric layer ILD to come into contact with one of the wiring lines 105. A via dielectric layer TVL may be disposed between the through via TSV and the semiconductor substrate 101. The via dielectric layer TVL may include silicon oxide.

The second passivation layer PL2 may include therein third conductive pads TE2 correspondingly connected to the through vias TSV. Top surfaces of the third conductive pads TE2 may be coplanar with a top surface PL2_U of the second passivation layer PL2. An upper connection structure US may include the semiconductor substrate 101, the through via TSV, the via dielectric layer TVL, the protection layer 110, the second passivation layer PL2, and the third conductive pads TE2. The third conductive pads TE2 may correspondingly overlap the second conductive pads TEL The third conductive pads TE2 may be called an upper conductive pad.

The first passivation layer PL1 may have a first thickness T1. The second passivation layer PL2 may have a second thickness T2 that is less than the first thickness T1. A third thickness (or distance) T3 between the top surface PL2_U of the second passivation layer PL2 and the second surface 101b of the semiconductor substrate 101 may be greater than the second thickness T2. The first thickness T1 may be, for example, from about 0.4 times to about 0.6 times the third thickness T3 (T1=T3×0.4~0.6). Therefore, at least one of the wiring lines 105 may be located at a level CV of a center of total thickness Tt of the semiconductor chip 500. Alternatively, in an embodiment, the wiring section MR may be located on a central region of the semiconductor chip 500.

In the middle of fabricating the semiconductor chip 500, there may be a difference in thermal expansion coefficient between materials included in the wiring lines 105, the first conductive pads 107, the second interlayer dielectric layer IMD, and the semiconductor substrate 101, which difference in thermal expansion coefficient may induce topography or local variations in heights of surfaces of the semiconductor chip 500. In an embodiment, as the first thickness T1 of the first passivation layer PL1 corresponds to about 0.4 times to about 0.6 times the third thickness T3, it may be possible to prevent or minimize topography degradation. As a result, the semiconductor chip 500 may increase in reliability.

The pad part PP of each of the second conductive pads TE1 may have a first width W1. Each of the third conductive pads TE2 may have a second width W2. The via part VP of each of the second conductive pads TE1 may have a first height H1 and a third width W3. The third width W3 may be less than one or more of the first width W1, the second width W2, and the first height H1. The second conductive pads TE1 may each have a step difference on a lateral surface thereof. Such structures of the second conductive pads TE1 may, in an embodiment, prevent electric short-circuits with the first conductive pads 107 adjacent to the second conductive pads TEL In addition, such structures of the second conductive pads TE1 may alleviate physical expansion of the second conductive pads TE1 to increase reliability of the semiconductor chip 500.

Figure 1B:
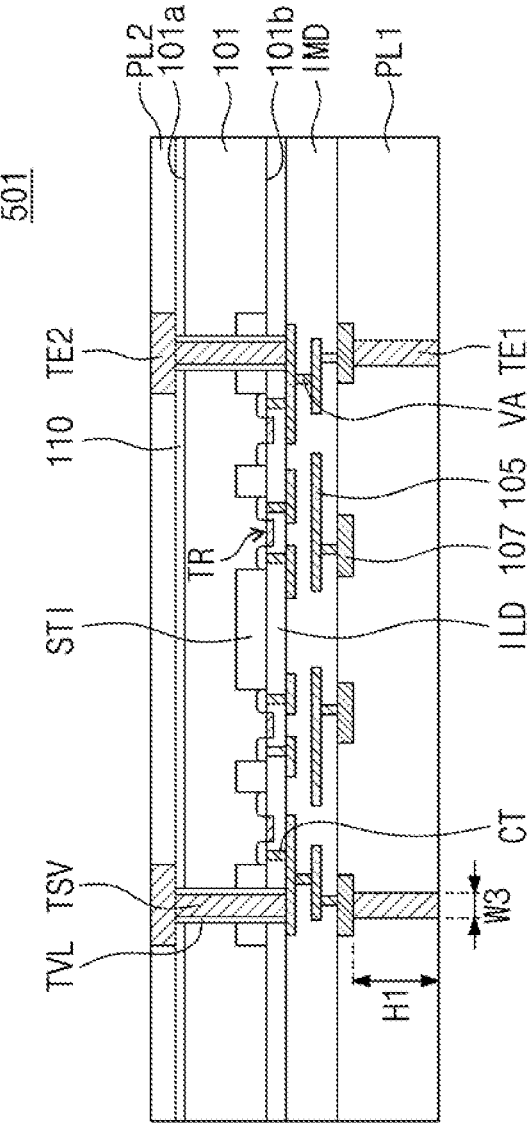

Referring to FIG. 1B, in a semiconductor chip 501 according to the present embodiment, the second conductive pads TE1 may each have a shape different from that of FIG. 1A. The second conductive pad TE1 may have a third width W3 that is constant as a whole. The third width W3 may be less than the first height H1 of the second conductive pad TEL Other structural features may be identical or similar to those discussed with reference to FIG. 1A.

Figure 1C:
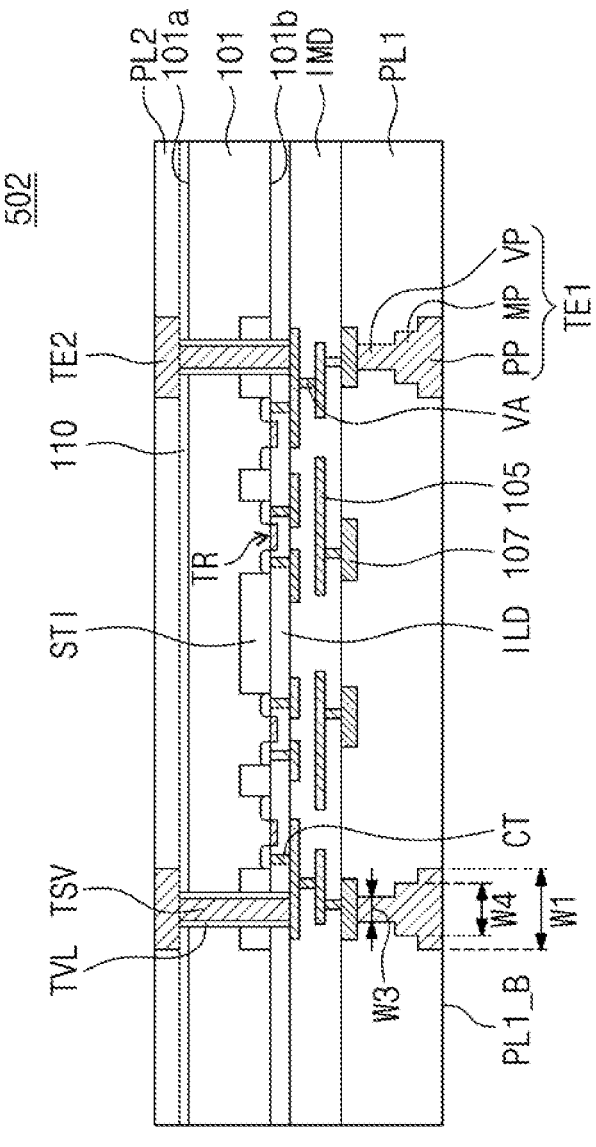

Referring to FIG. 1C, in a semiconductor chip 502 according to the present embodiment, the second conductive pads TE1 may each have a shape different from that of FIG. 1A. Each of the second conductive pads TE1 may further include a middle connection part MP between the via part VP and the pad part PP. The via part VP, the pad part PP, and the middle connection part MP may be integrally connected into a single unitary piece. The middle connection part MP may have a fourth width W4 less than the first width W1 and greater than the third width W3. The second conductive pads TE1 may each have a stepped structure on a sidewall thereof. Other structural features may be identical or similar to those discussed with reference to FIG. 1A.

Figure 1D:
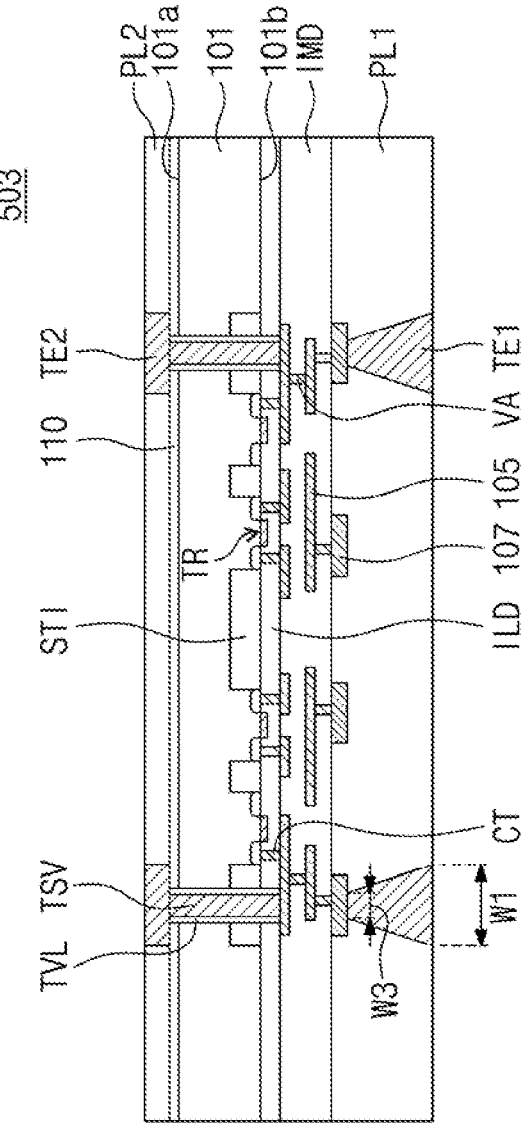

Referring to FIG. 1D, in a semiconductor chip 503 according to the present embodiment, the second conductive pads TE1 may each have a shape different from that of FIG. 1A. The second conductive pads TE1 may each have a width that gradually decreases in an upward direction. For example, a bottom surface of each of the second conductive pads TE1 may have a first width W1, and a top surface of each of the second conductive pads TE1 may have a third width W3 less than the first width W1. The second conductive pads TE1 may each be oblique on a lateral surface thereof. Other structural features may be identical or similar to those discussed with reference to FIG. 1A.

Figure 1E:
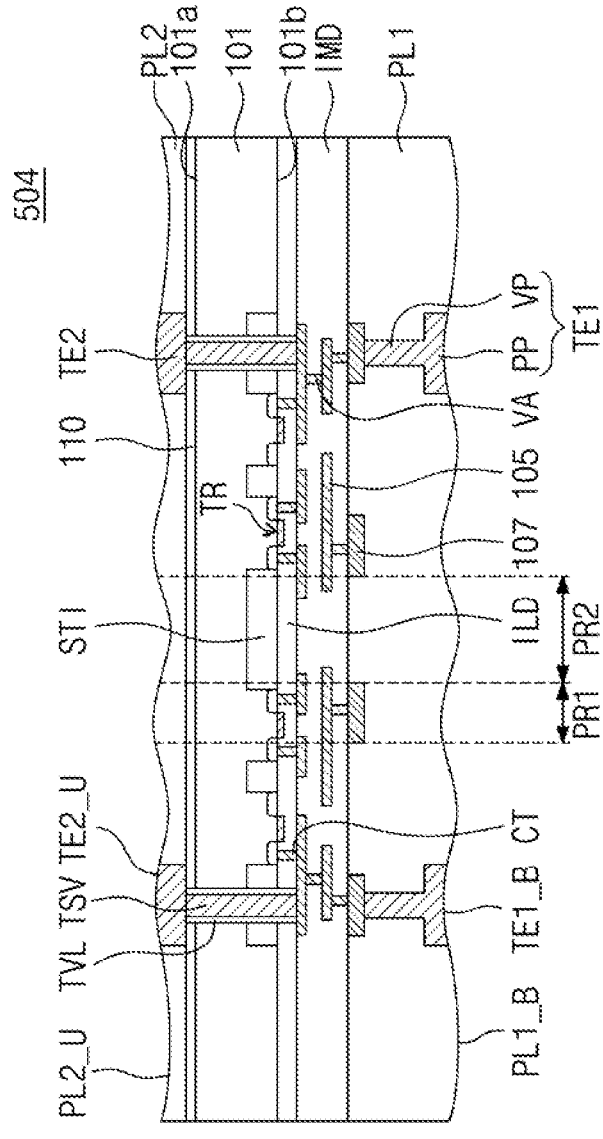

Referring to FIG. 1E, a semiconductor chip 504 according to the present embodiment may have an uneven structure on top and bottom surfaces thereof. For example, the bottom surface PL1_B of the first passivation layer PL1 may have a first area PR1 that overlaps the first conductive pad 107 and a second area PR2 that overlaps a position between the first conductive pads 107. The first area PR1 of the first passivation layer PL1 may be more recessed toward the first conductive pad 107 than the second area PR2 of the first passivation layer PL1. The second area PR2 of the first passivation layer PL1 may protrude more outwardly than the first area PR1 of the first passivation layer PL1. The second conductive pads TE1 may have their bottom surfaces that are recessed toward the first conductive pads 107. Additionally or alternately, the top surface PL2_U of the second passivation layer PL2 may have a first area PR1 that overlaps the first conductive pad 107 and a second area PR2 that overlaps a position between the first conductive pads 107. The second area PR2 of the second passivation layer PL2 may be more recessed toward the semiconductor substrate 101 than the first area PR1 of the second passivation layer PL2. The first area PR1 of the second passivation layer PL2 may protrude more outwardly than the second area PR2 of the second passivation layer PL2. The third conductive pads TE2 may have top surfaces that also protrude outwardly. In an embodiment, one of the first conductive pads 107 may also be referred to as a fourth conductive pad. Other structural features may be identical or similar to those discussed with reference to FIG. 1A.

FIGS. 2A to 2G illustrates cross-sectional views showing a method of fabricating a semiconductor chip 500 shown in cross-sectional view in FIG. 1A.

Figure 2A:
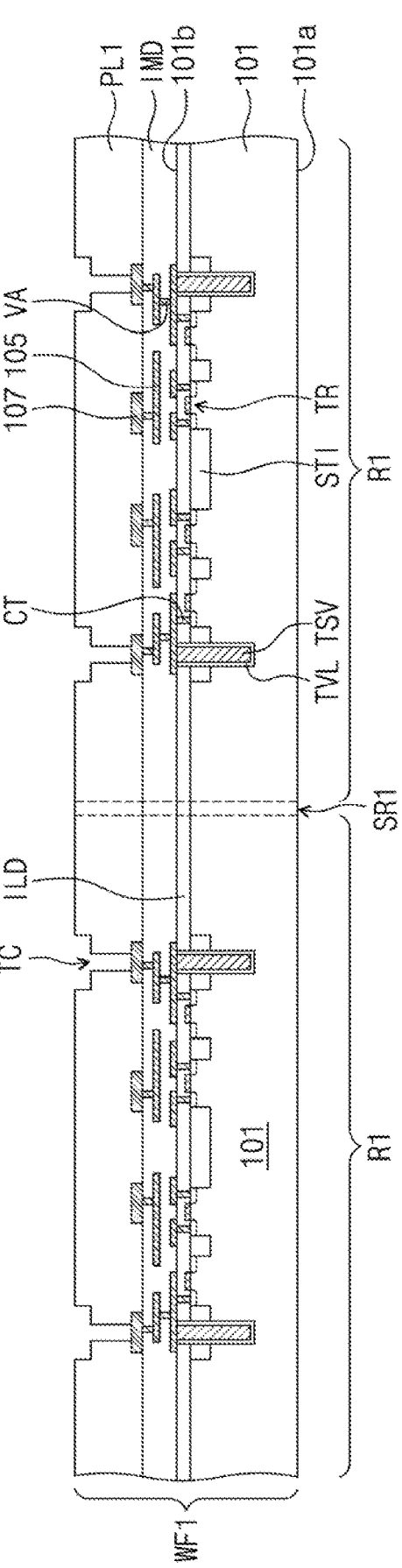
FIGS. 2A to 2G illustrates cross-sectional views showing a method of fabricating a semiconductor chip whose cross-sectional view is shown in FIG. 1A.

Referring to FIG. 2A, a wafer structure WF1 may be prepared. The preparation of the wafer structure WF1 may include defining an active region by forming a device isolation layer STI on a second surface 101b of a semiconductor substrate 101 that has device areas R1 and a scribe lane area SR1 between the device areas R1. Transistors TR may be formed on the second surface 101b of the semiconductor substrate 101. A first interlayer dielectric layer ILD may be formed on the second surface 101b and the transistors TR. For example, the first interlayer dielectric layer ILD may be formed to cover the second surface 101b and the transistors TR. The first interlayer dielectric layer ILD may be etched to form contact holes, and the contact holes may be filled with a conductive material to form contacts CT. The first interlayer dielectric layer ILD, the device isolation layer STI, and the semiconductor substrate 101 may be etched to form a through via hole, and a via dielectric layer VL may be conformally formed on an inner wall of the through via hole. The through via hole may be filled with a conductive material, and then a chemical mechanical polishing (CMP) process or an etch-back process may be performed to form a through via TSV. Multi-layered wiring lines 105, an internal via VA, and a second interlayer dielectric layer IMD may be formed on the first interlayer dielectric layer ILD. First conductive pads 107 may be formed on the second interlayer dielectric layer IMD. A first passivation layer PL1 may be formed on the second interlayer dielectric layer IMD. An etching process may be performed to form a first trench TC in the first passivation layer PL1. The first trench TC may have a dual damascene hole shape when viewed in vertical section. The first trench TC may expose a portion of the first conductive pad 107. The first passivation layer PL1 may be formed to have a first thickness T1 of FIG. 1A.

Figure 2B:
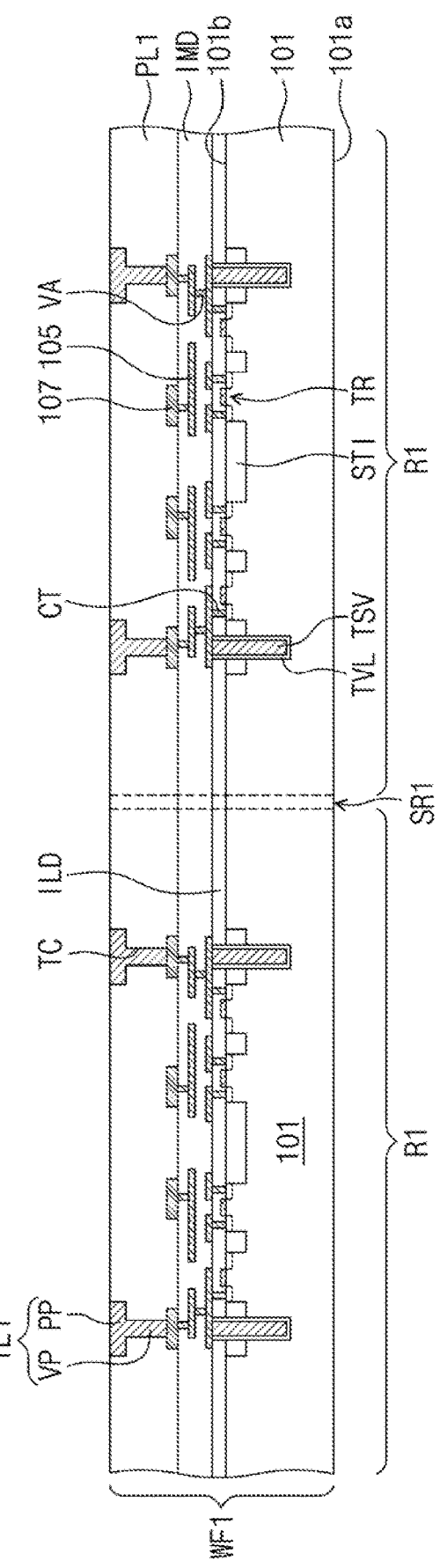

Referring to FIG. 2B, a conductive layer may be stacked on the first passivation layer PL1, filling the first trench TC. A chemical mechanical polishing (CMP) process or an etch-back process may be performed to expose a top surface of the first passivation layer PL1 and to form a second conductive pad TE1 in the first trench TC.

Figure 2C:
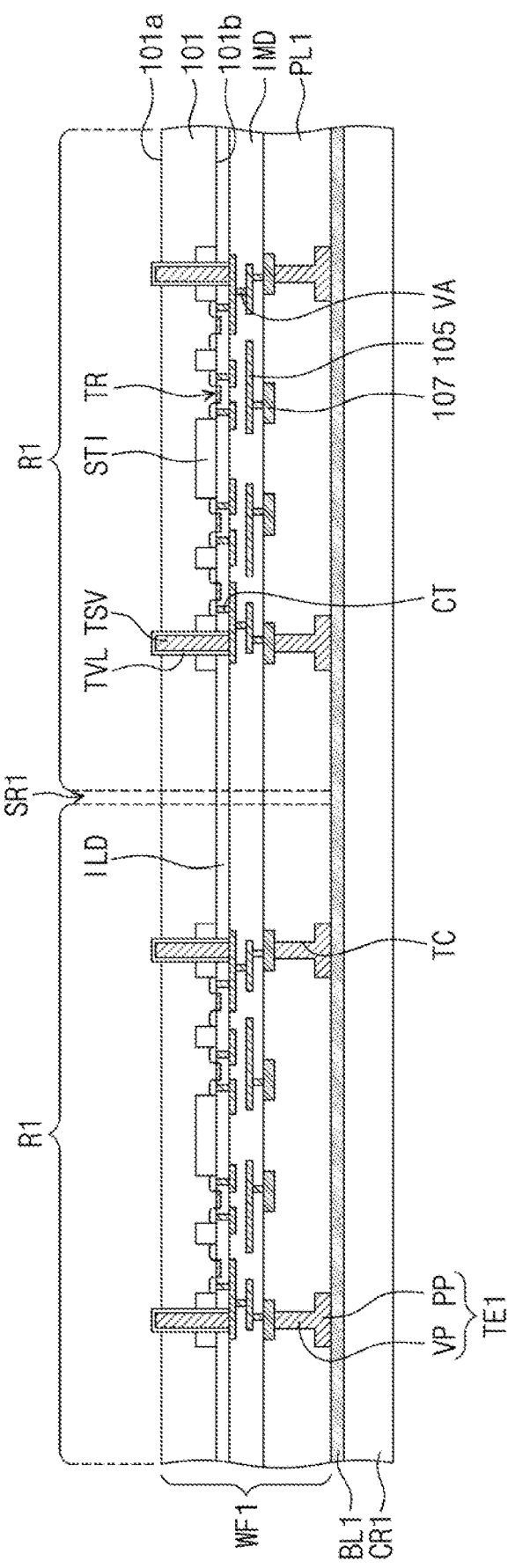

Referring to FIGS. 2B and 2C, a first carrier substrate CR1 may be bonded through a first adhesion layer BL1 onto the first passivation layer PL1. The wafer structure WF1 may be turned upside down, and a back grinding process may be performed on a first surface 101a of the semiconductor substrate 101. Therefore, the via dielectric layer VL may be exposed on a top surface and an upper sidewall thereof.

There may be a difference in thermal expansion coefficient between materials included in the wiring lines 105, the first conductive pads 107, the second interlayer dielectric layer IMD, and the semiconductor substrate 101, which difference in thermal expansion coefficient may induce topography or local variations in heights of surfaces of the wafer structure WF1. In the back grinding process, a physical stress (e.g., shear stress) may occur at an interface between the wafer structure WF1 and the first adhesion layer BL1. When the first thickness T1 of the first passivation layer PL1 is as small as the second thickness T2 of FIG. 1A, the physical stress occurring in the back grinding process may cause topography degradation (or height variations) on the surface of the wafer structure WF1, which may result in the creation of crack in a finally fabricated semiconductor chip. In contrast, in the present embodiment, because the first thickness T1 of the first passivation layer PL1 is sufficiently greater than the second thickness T2 and is about 0.4 times to about 0.6 times the third thickness T3 of FIG. 1A, physical stress occurring in the back grinding process may be prevented, minimized, or alleviated. Therefore, in an embodiment, it may be possible to prevent/minimize/alleviate topography degradation on the surface of the wafer structure WF1, to suppress process defects, and to increase a yield. In addition, a finally fabricated semiconductor chip may increase in reliability.

Figure 2D:
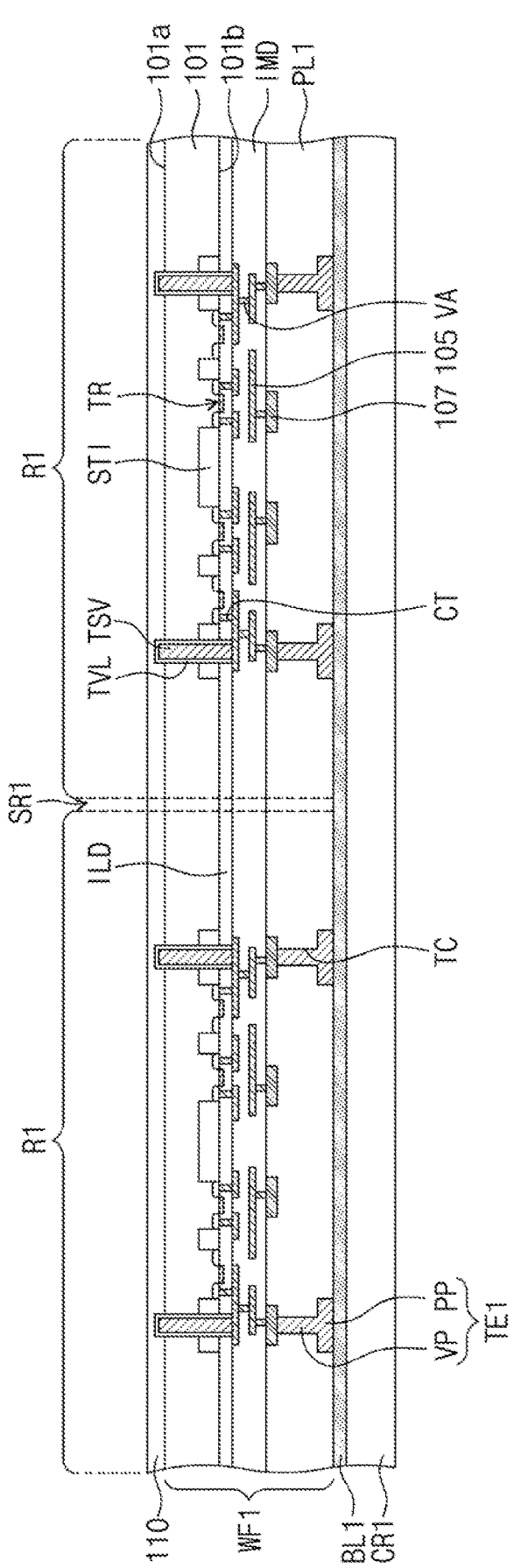

Referring to FIG. 2D, a protection layer 110 may be stacked on the first surface 101a of the semiconductor substrate 101. The protection layer 110 may be formed on a top surface and an upper sidewall of the via dielectric layer VL For example, the protection layer 110 may cover the top surface and the upper sidewall of the via dielectric layer VL.

Figure 2E:
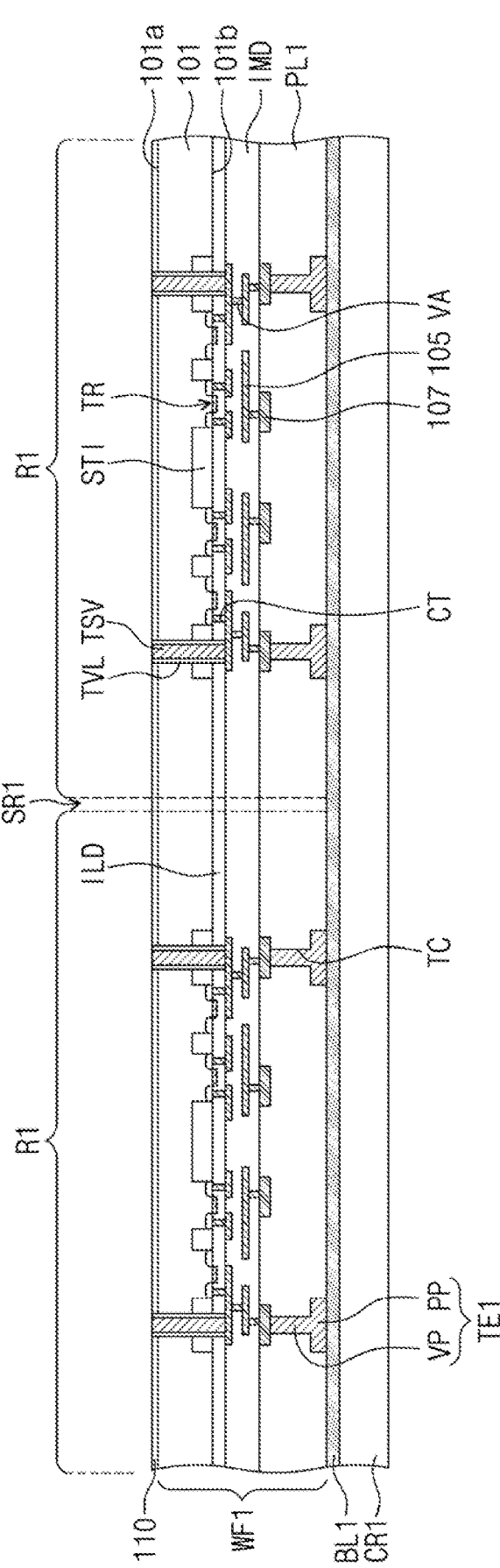

Referring to FIG. 2E, an etch-back process may be performed on the protection layer 110 such that the protection layer 110 and the via dielectric layer VL may be partially removed to expose the through via TSV.

Figure 2F:
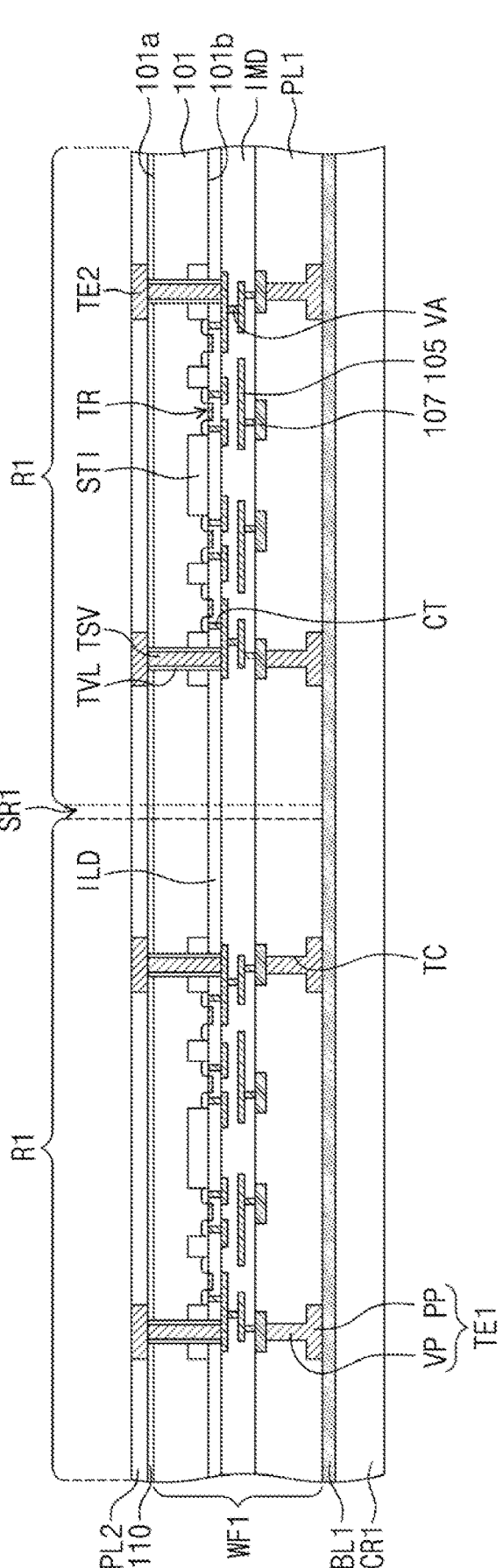

Referring to FIG. 2F, a second passivation layer PL2 may be formed on the protection layer 110. The second passivation layer PL2 may be etched to form a second trench that exposes the through via TSV. A conductive layer may be stacked to fill the second trench, and the conductive layer may undergo a chemical mechanical polishing (CMP) process or an etch-back process to form third conductive pads TE2.

Figure 2G:
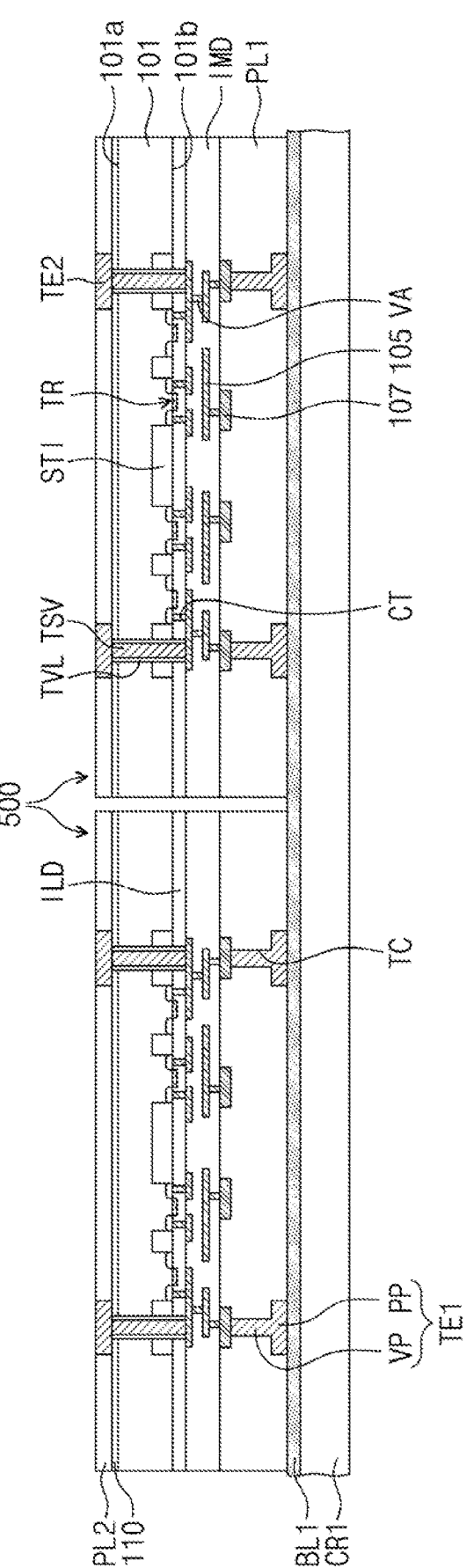

Referring to FIGS. 2F and 2G, a singulation (or sawing) process may be performed to irradiate a laser to the scribe lane area SR1, and thus the wafer structure WF1 may be cut to fabricate an individual semiconductor chip 500. The first adhesion layer BL1 and the first carrier substrate CR1 may be removed. According to the manufacturing method of the embodiment, an individual semiconductor chip 500 as shown in FIG. 1A may be fabricated.

Figure 3A:
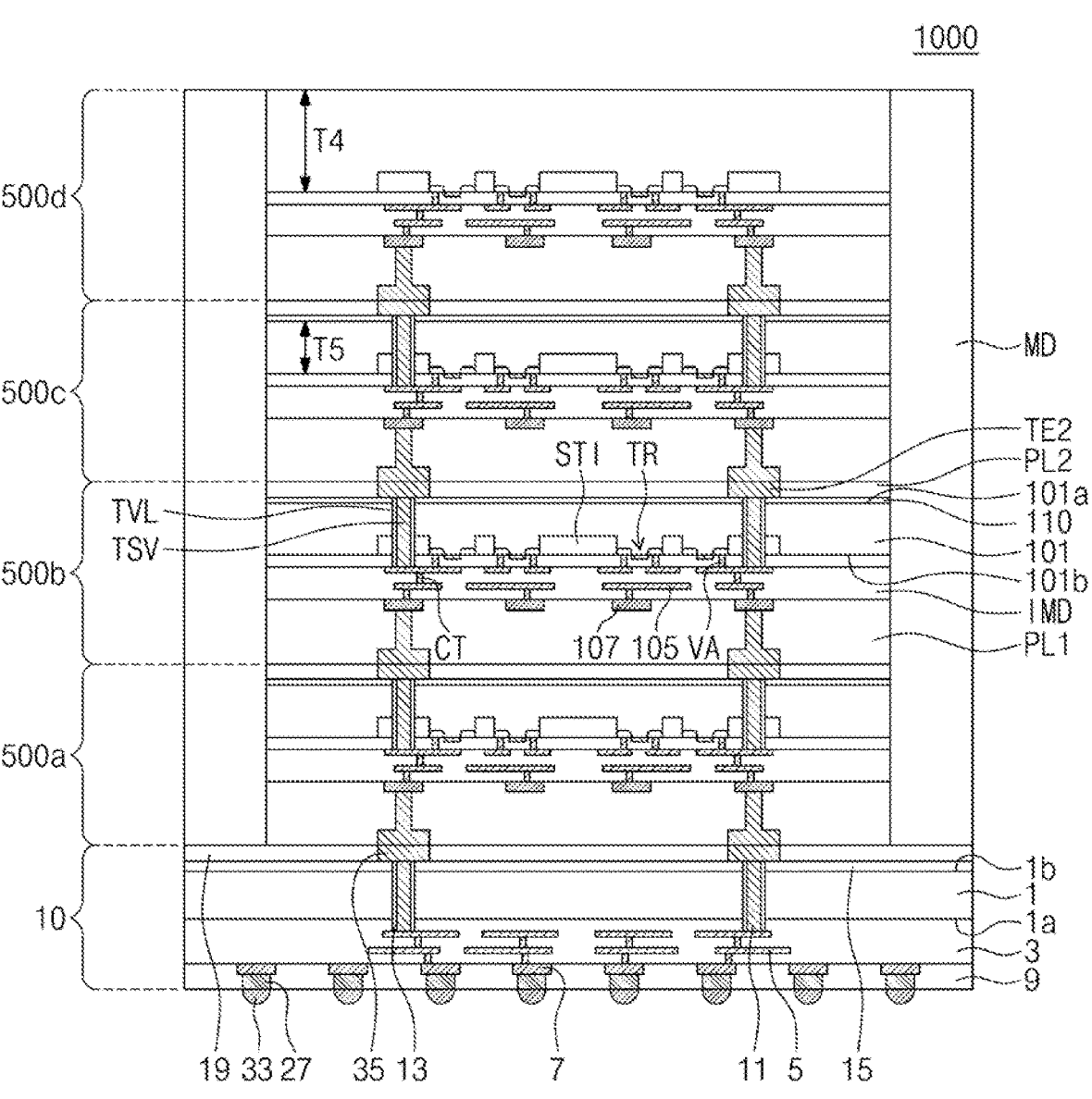
FIGS. 3A and 3B illustrate cross-sectional views showing a semiconductor package according to example embodiments.
Figure 3B:
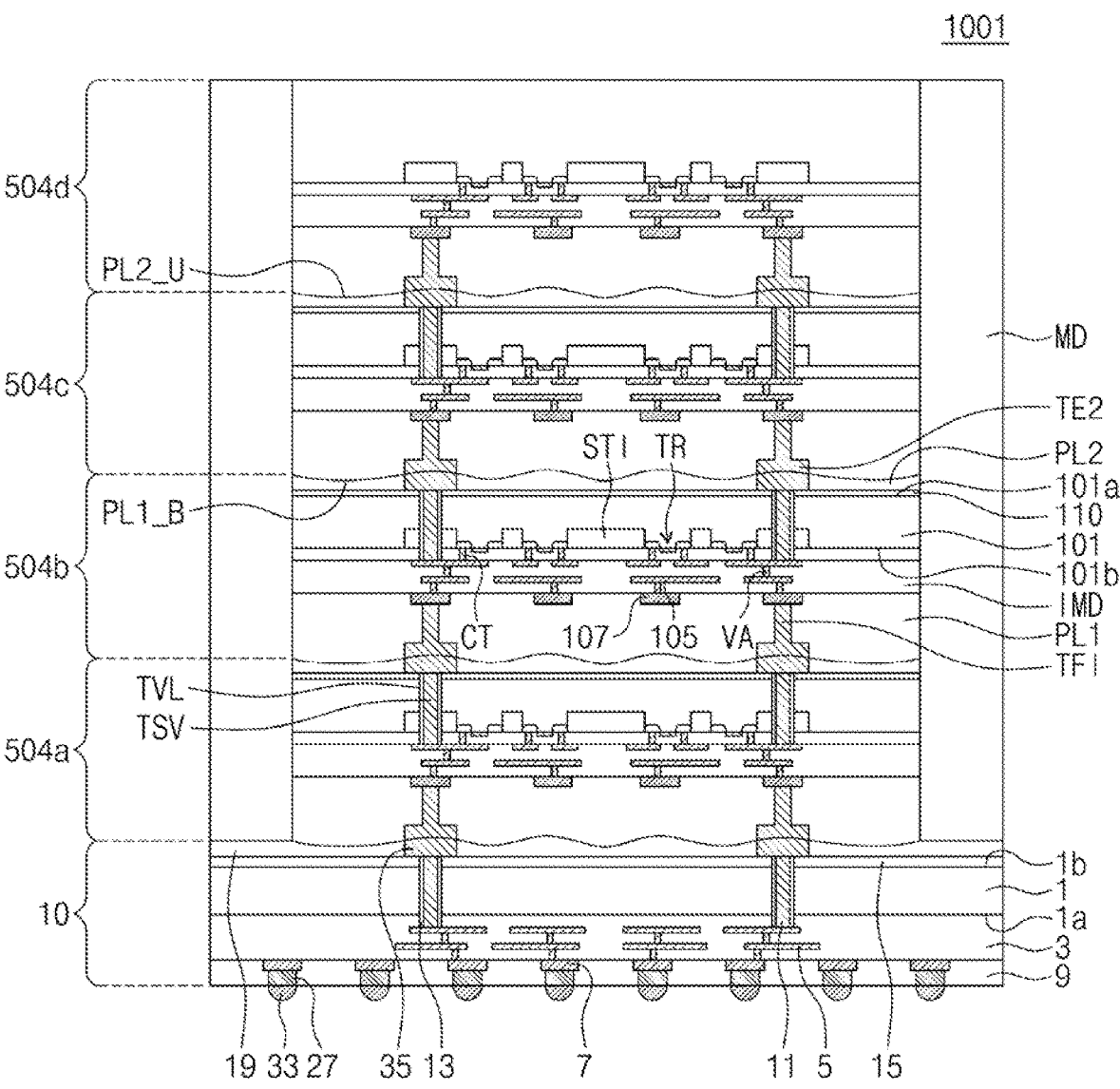

FIGS. 3A and 3B illustrate cross-sectional views showing a semiconductor package according to various embodiments.

Referring to FIG. 3A, a semiconductor package 1000 according to the present embodiment may include first semiconductor chip 500a, second semiconductor chip 500b, third semiconductor chip 500c and fourth semiconductor chip 500d that are sequentially stacked on a buffer die 10. The buffer die 10 may be an interposer or a logic circuit chip. The buffer die 10 may include a buffer semiconductor substrate 1. The buffer semiconductor substrate 1 may have a first surface 1a and a second surface 1b that are opposite to each other. A buffer interlayer dielectric layer 3 may be disposed on the first surface 1a of the buffer semiconductor substrate 1. The buffer interlayer dielectric layer 3 may be provided with buffer lines 5 therein. First buffer conductive pads 7 may be disposed below the buffer interlayer dielectric layer 3. A first buffer passivation layer 9 may be formed on the first buffer conductive pads 7 and the buffer interlayer dielectric layer 3. For example, the first buffer conductive pads 7 and the buffer interlayer dielectric layer 3 may be covered with a first buffer passivation layer 9. The first buffer passivation layer 9 may be provided therein with second buffer conductive pads 27 in contact with the first buffer conductive pads 7. Solder balls 33 may be bonded to the second buffer conductive pads 27. A buffer protection layer 15 may be formed on the second surface 1b of the buffer semiconductor substrate 1. For example, the second surface 1b of the buffer semiconductor substrate 1 may be covered with the buffer protection layer 15. A buffer through via 11 may penetrate the buffer semiconductor substrate 1, the buffer protection layer 15, and a portion of the buffer interlayer dielectric layer 3 to come into contact with one of buffer lines 5. A buffer via dielectric layer 13 may be interposed between the buffer through via 11 and the buffer semiconductor substrate 1. A second buffer passivation layer 19 may be formed on the buffer protection layer 15. For example, the buffer protection layer 15 may be covered with the second buffer passivation layer 19. The second buffer passivation layer 19 may be provided therein with a third buffer conductive pad 35 connected to the buffer through via 11.

Each of the first to fourth semiconductor chips 500a to 500d may have the same structure as that of the semiconductor chip 500 discussed with reference to FIG. 1A. However, the fourth semiconductor chip 500d at a top position may not have any of the through via TSV, the via dielectric layer TVL, the protection layer 110, the second passivation layer PL2, and the third conductive pad TE2. The semiconductor substrate 101 of the fourth semiconductor chip 500d may have a fourth thickness T4, and the semiconductor substrate 101 of one or more of the first semiconductor chip 500a, second semiconductor chip 500b and third semiconductor chip 500c may have a fifth thickness T5 less than the fourth thickness T4. The first to fourth semiconductor chips 500a to 500d may be the same memory chip as each other. The memory chip may be, for example, dynamic random access memory (DRAM), NAND Flash, static random access memory (SRAM), magnetic random access memory (MRAM), phase change random access memory (PRAM), or resistive random access memory (RRAM). The present embodiment discloses a structure where one logic circuit chip and four memory chips are stacked, but the number of the logic circuit chip and the number of the memory chips may be variously changed without being limited thereto. The semiconductor package 1000 may be a high bandwidth memory (HBM) chip.

A mold layer MD may be formed on a top surface of the buffer die 10 and lateral surfaces of the first to fourth semiconductor chips 500a to 500d. For example, the mold layer MD may cover the top surface of the buffer die 10 and lateral surfaces of the first to fourth semiconductor chips 500a to 500d. The mold layer MD may include a dielectric resin, for example, an epoxy molding compound (EMC). The mold layer MD may further include fillers, and the fillers may be dispersed in the dielectric resin. The fillers may include, for example, silicon oxide ($SiO_2$). A top surface of the mold layer MD may be coplanar with the first surface 101a of the semiconductor substrate 101 of the fourth semiconductor chip 500d.

As the semiconductor package 1000 according to the present embodiment includes the first to fourth semiconductor chips 500a to 500d each of which has increased reliability as discussed with reference to FIG. 1A, the semiconductor package 1000 may increase in reliability.

Referring to FIG. 3B, a semiconductor package 1001 according to the present embodiment may include first to fourth semiconductor chip 504a to 504d that are sequentially stacked on a buffer die 10. Each of the first to fourth semiconductor chips 504a to 504d may be the same as that discussed with reference to FIG. 1E. The first to fourth semiconductor chips 504a to 504d may have their top and bottom surfaces PL2_U and PL2_B each of which has an uneven structure and which are engaged with each other. Other structural features may be identical or similar to those discussed with reference to FIG. 3A.

Figure 4:
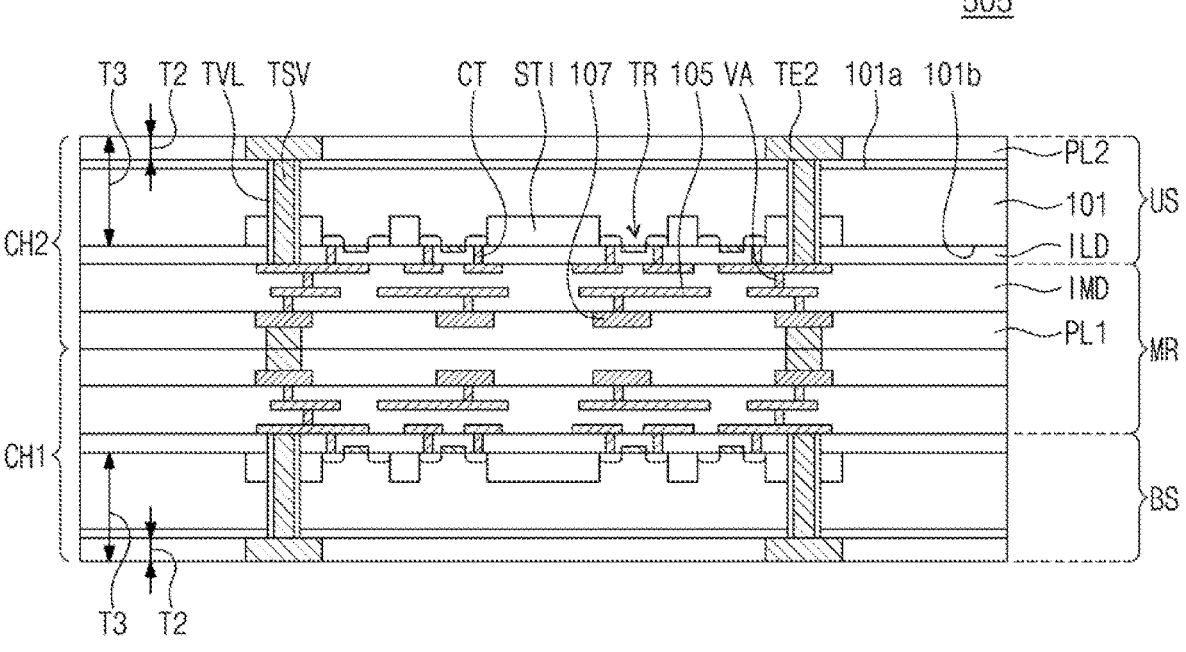
FIG. 4 illustrates a cross-sectional view showing a semiconductor chip according to example embodiments.

FIG. 4 illustrates a cross-sectional view showing a semiconductor chip according to an embodiment.

Referring to FIG. 4, a semiconductor chip 505 according to the present embodiment may include a first sub-chip CH1 and a second sub-chip CH2 bonded onto the first sub-chip CH1. The first sub-chip CH1 and the second sub-chip CH2 may have the same function/structure, or may have symmetry with each other. The first sub-chip CH1 and the second sub-chip CH2 may be, for example, memory chips. Each of the first and second sub-chips CH1 and CH2 may have a structure identical or similar to that of the semiconductor chip 501 shown in FIG. 1B and may have a shape (e.g., aspect ratio) different from that of the second conductive pad TE1.

A bonding process may be performed in such a way that the second sub-chip CH2 may be turned upside down and bonded to the first sub-chip CH1. For example, the first passivation layer PL1 of the first sub-chip CH1 may be bonded to the first passivation layer PL1 of the second sub-chip CH2. The second conductive pad TE1 of the first sub-chip CH1 may be bonded to the second conductive pad TE1 of the second sub-chip CH2. The first passivation layers PL1 of the first and second sub-chips CH1 and CH2 may each be called an interface dielectric layer. The second conductive pads TE1 of the first and second sub-chips CH1 and CH2 may each be called a connection conductive pattern.

The second passivation layers PL2 of the first and second sub-chips CH1 and CH2 may have the same second thickness T2. A third thickness T3 between an outer surface of the second passivation layer PL2 and the second surface 101b of the semiconductor substrate 101 may be the same for both the first sub-chip CH1 and the second sub-chip CH2.

In the semiconductor chip 505 according to the present embodiment, a wiring section MR may be constituted by the wiring lines 105, the second interlayer dielectric layers IMD, the first conductive pads 107, the second conductive pads TE1, and the first passivation layers PL1 of the first and second sub-chips CH1 and CH2. The wiring section MR may have a vertically symmetrical structure around an interface between the first passivation layers PL1.

A lower connection structure BS may be constituted by the first interlayer dielectric layer ILD, the contacts CT, the semiconductor substrate 101, the protection layer 110, the second passivation layer PL2, the through via TSV, the via dielectric layer TVL, and the third conductive pad TE2 of the first sub-chip CH1. An upper connection structure US may include the first interlayer dielectric layer ILD, the contacts CT, the semiconductor substrate 101, the protection layer 110, the second passivation layer PL2, the through via TSV, the via dielectric layer TVL, and the third conductive pad TE2 of the second sub-chip CH2.

The lower and upper connection structures BS and US may have thicknesses that are substantially the same as each other and their structures that are symmetrical with respect to each other. Therefore, in the semiconductor chip 505 according to the present embodiment, the wiring section MR may be located at a central portion of the semiconductor chip 505. Therefore, in the embodiment, it may be possible to prevent or minimize topography of the semiconductor chip 505. As a result, the semiconductor chip 505 may increase in reliability. The through via TSV of the first sub-chip CH1 may vertically overlap the through via TSV of the second sub-chip CH2.

FIGS. 5A to 5E illustrate cross-sectional views showing a method of fabricating a semiconductor chip shown in FIG. 4.

Figure 5A:
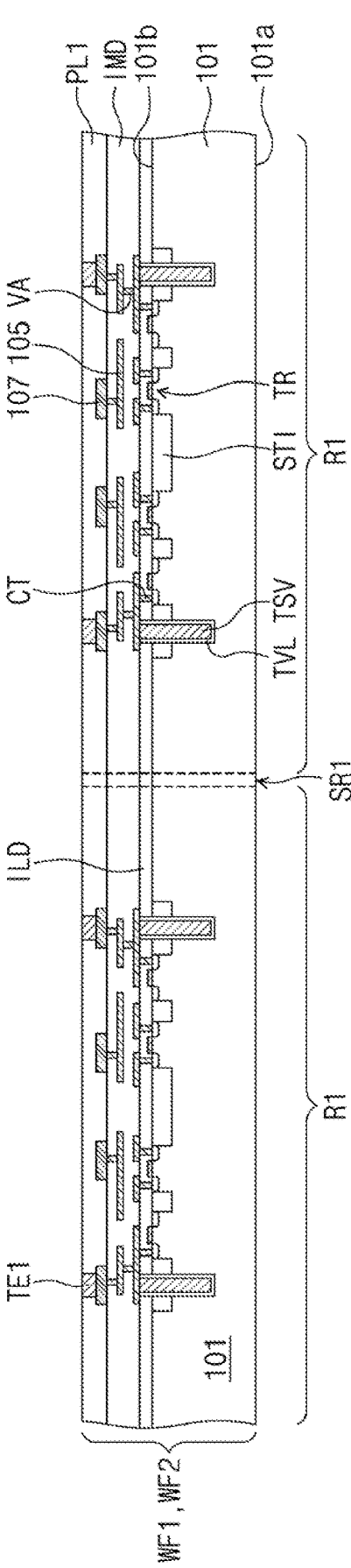
FIGS. 5A to 5E illustrate cross-sectional views showing a method of fabricating a semiconductor chip shown in FIG. 4.

Referring to FIG. 5A, first and second wafer structures WF1 and WF2 may each be prepared. The preparation of the first and second wafer structures WF1 and WF2 may include defining an active region by forming a device isolation layer STI on a second surface 101b of a semiconductor substrate 101 that has device areas R1 and a scribe lane area SR1 between the device areas R1. Transistors TR may be formed on the second surface 101b of the semiconductor substrate 101. A first interlayer dielectric layer ILD may be formed on the second surface 101b and the transistors TR. For example, the first interlayer dielectric layer ILD may cover the second surface 101b and the transistors TR. The first interlayer dielectric layer ILD may be etched to form contact holes, and the contact holes may be filled with a conductive material to form contacts CT. The first interlayer dielectric layer ILD, the device isolation layer STI, and the semiconductor substrate 101 may be etched to form a through via hole, and a via dielectric layer VL may be conformally formed on an inner wall of the through via hole. The through via hole may be filled with a conductive material, and then a chemical mechanical polishing (CMP) process or an etch-back process may be performed to form a through via TSV. Multi-layered wiring lines 105, an internal via VA, and a second interlayer dielectric layer IMD may be formed on the first interlayer dielectric layer ILD. First conductive pads 107 may be formed on the second interlayer dielectric layer IMD. A first passivation layer PL1 may be formed on the second interlayer dielectric layer IMD. An etching process may be performed to form a first trench in the first passivation layer PL1. A conductive layer may be stacked on the first passivation layer PL1 to fill the first trench. A chemical mechanical polishing (CMP) process or an etch-back process may be performed to expose a top surface of the first passivation layer PL1 and to form a second conductive pad TE1 in the first trench.

Figure 5B:
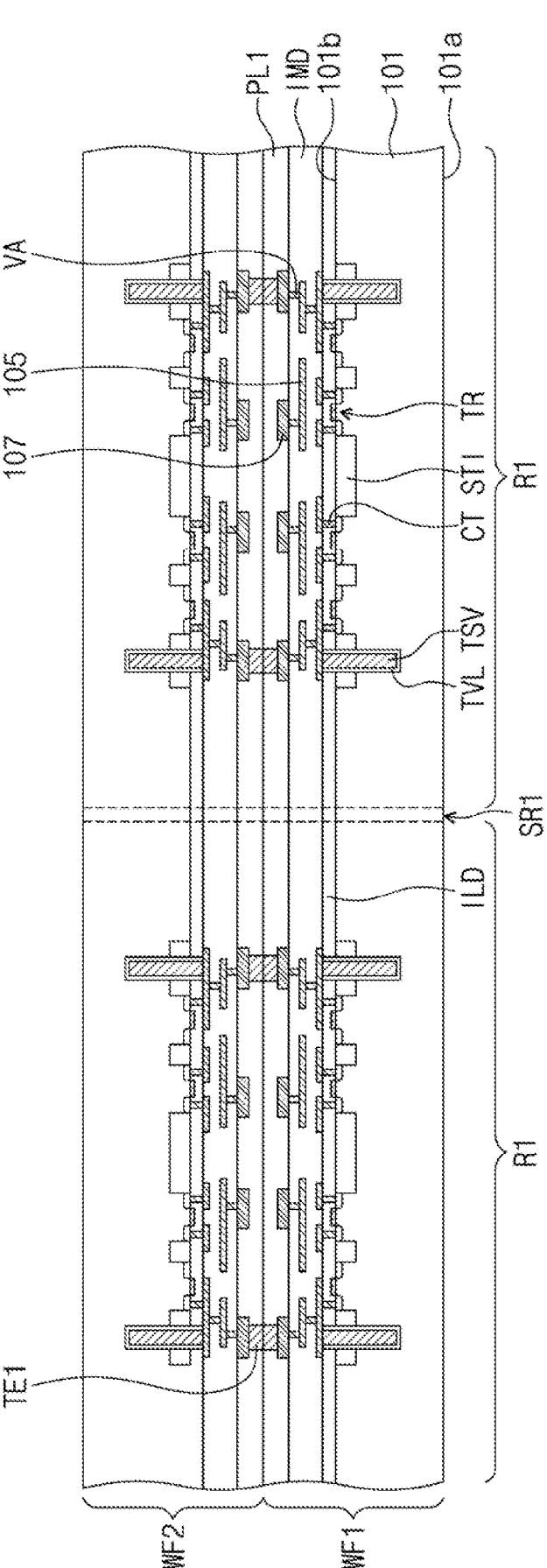

Referring to FIG. 5B, a plasma treatment process and a thermocompression process may be performed to bond the second wafer structure WF2 onto the first wafer structure WF1. The first passivation layer PL1 of the first wafer structure WF1 may be bonded to the first passivation layer PL1 of the second wafer structure WF2. The second conductive pad TE1 of the first wafer structure WF1 may be boded to the second conductive pad TE1 of the second wafer structure WF2.

Figure 5C:
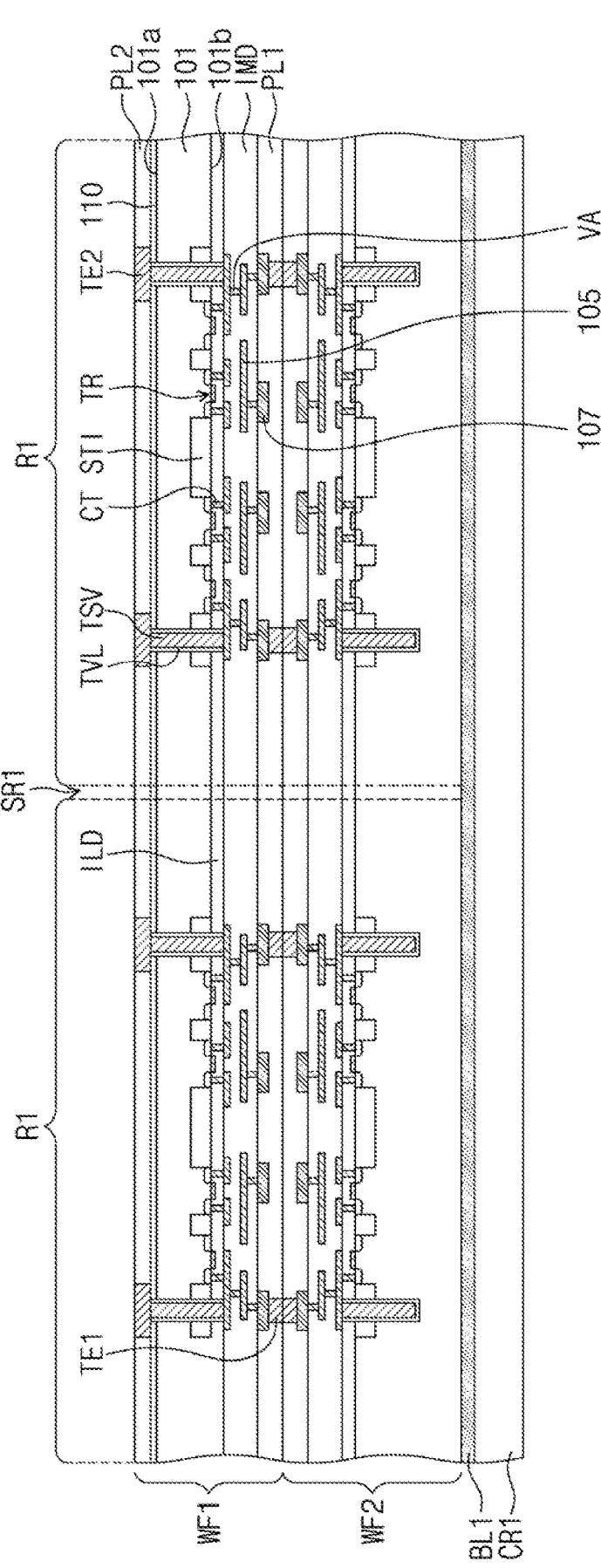

Referring to FIG. 5C, a first carrier substrate CR1 may be bonded through a first adhesion layer BL1 to a first surface 101a of the semiconductor substrate 101 included in the second wafer structure WF2. The first surface 101a of the semiconductor substrate 101 included in the second wafer structure WF2 may undergo a first back grinding process to expose a top surface and an upper sidewall of the via dielectric layer VL.

As the semiconductor substrate 101 of the second wafer structure WF2 separates the first adhesion layer BL1 at a sufficient distance from the second interlayer dielectric layers IMD of the first and second wafer structures WF1 and WF2, the first and second wafer structures WF1 and WF2 may be prevented/minimized/alleviated from topography degradation due to physical stress occurring in the first back grinding process. Accordingly, in an embodiment, aa finally fabricated semiconductor chip may increase in reliability.

A protection layer 110 may be stacked on the first surface 101a of the semiconductor substrate 101 included in the first wafer structure WF1. The protection layer 110 may be formed on the top surface and the upper sidewall of the via dielectric layer VL. For example, the protection layer 110 may cover the top surface and the upper sidewall of the via dielectric layer VL. An etch-back process may be performed on the protection layer 110 such that the protection layer 110 and the via dielectric layer VL may be partially removed to expose the through via TSV. A second passivation layer PL2 may be formed on the protection layer 110. The second passivation layer PL2 may be etched to form a second trench that exposes the through via TSV. A conductive layer may be stacked to fill the second trench, and the conductive layer may undergo a chemical mechanical polishing (CMP) process or an etch-back process to form third conductive pads TE2.

Figure 5D:
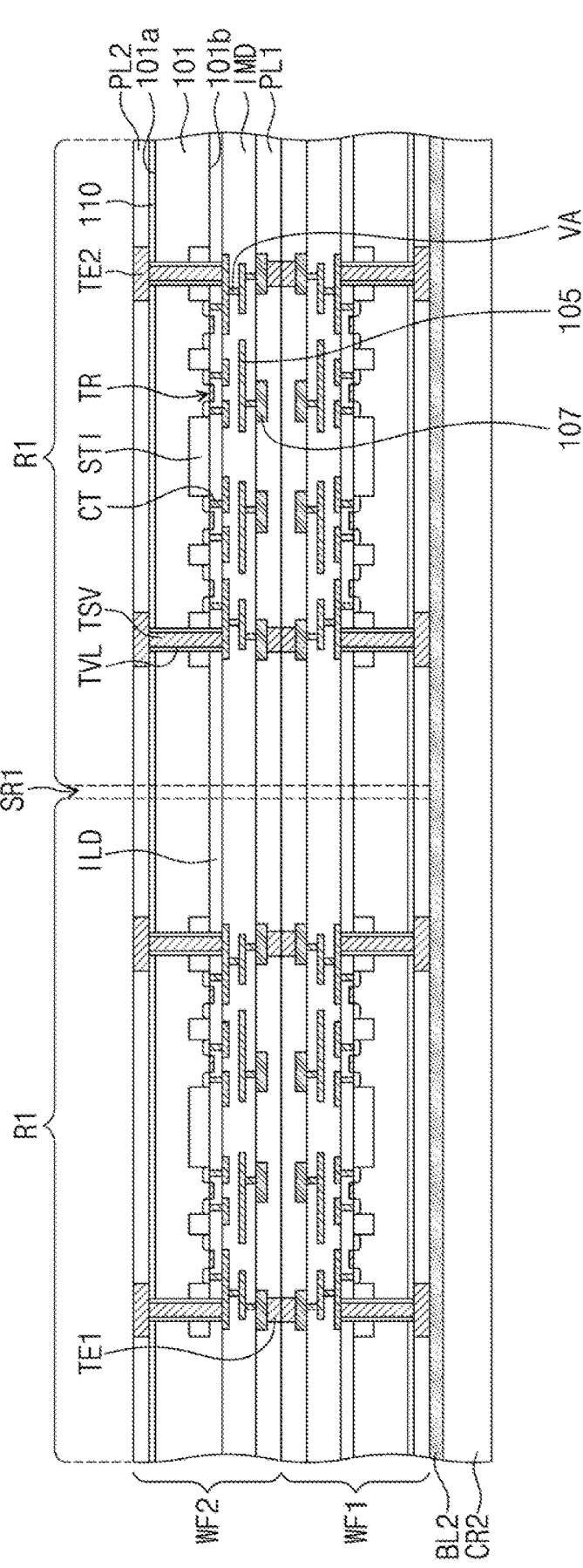

Referring to FIG. 5D, the first adhesion layer BL1 and the first carrier substrate CR1 may be removed from the first surface 101a of the semiconductor substrate 101 included in the second wafer structure WF2. A second carrier substrate CR2 may be bonded through a second adhesion layer BL2 onto the second passivation layer PL2 of the first wafer structure WF1. The first surface 101a of the semiconductor substrate 101 included in the second wafer structure WF2 may undergo a second back grinding process to expose the top surface and the upper sidewall of the via dielectric layer VL.

As the semiconductor substrate 101 of the first wafer structure WF1 separates the second adhesion layer BL2 at a sufficient distance from the second interlayer dielectric layers IMD of the first and second wafer structures WF1 and WF2, the first and second wafer structures WF1 and WF2 may be prevented/minimized/alleviated from topography degradation due to physical stress occurring in the second back grinding process. Accordingly, according to an embodiment, a finally fabricated semiconductor chip may increase in reliability.

A protection layer 110 may be stacked on the first surface 101a of the semiconductor substrate 101 included in the second wafer structure WF2. The protection layer 110 may be formed on the top surface and the upper sidewall of the via dielectric layer VL. For example, the protection layer 110 may cover the top surface and the upper sidewall of the via dielectric layer VL. An etch-back process may be performed on the protection layer 110 such that the protection layer 110 and the via dielectric layer VL may be partially removed to expose the through via TSV. A second passivation layer PL2 may be formed on the protection layer 110. The second passivation layer PL2 may be etched to form a second trench that exposes the through via TSV. A conductive layer may be stacked to fill the second trench, and the conductive layer may undergo a chemical mechanical polishing (CMP) process or an etch-back process to form third conductive pads TE2.

Figure 5E:
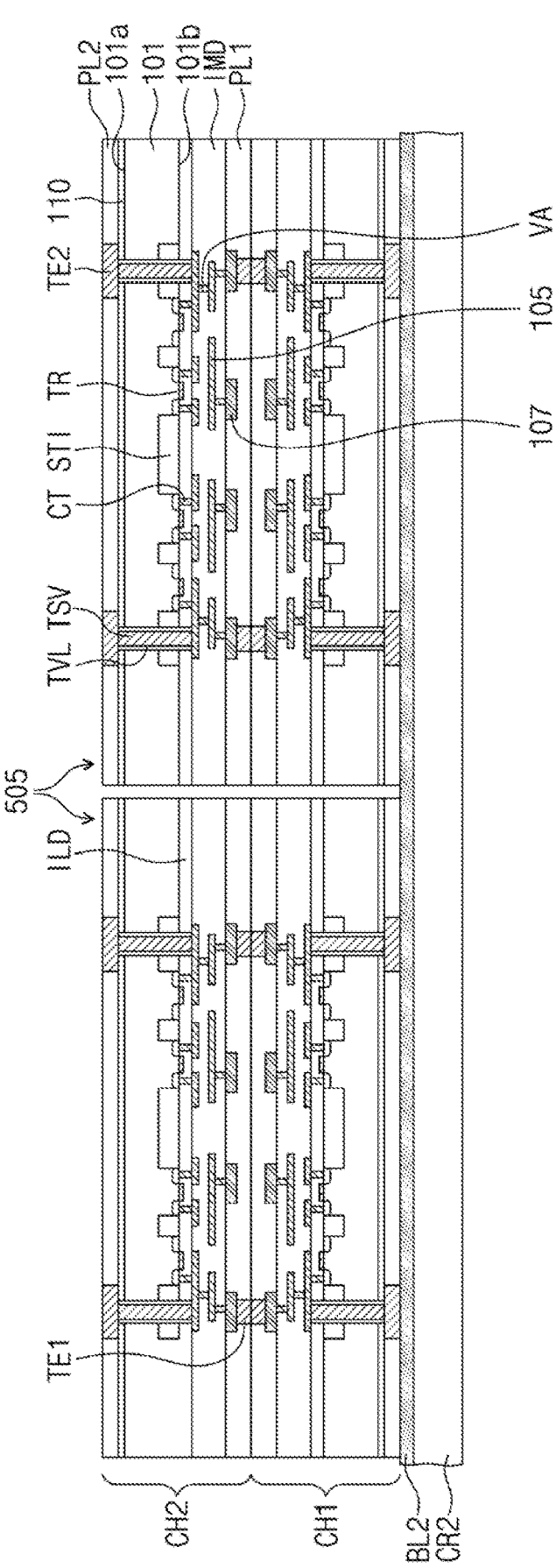

Referring to FIGS. 5D and 5E, a singulation (or sawing) process may be performed to irradiate a laser to the scribe lane area SRL and thus the first and second wafer structures WF1 and WF2 may be cut to fabricate an individual semiconductor chip 505. The second adhesion layer BL2 and the second carrier substrate CR2 may be removed. Therefore, an individual semiconductor chip 505 may be fabricated as shown in FIG. 4.

Figure 6:
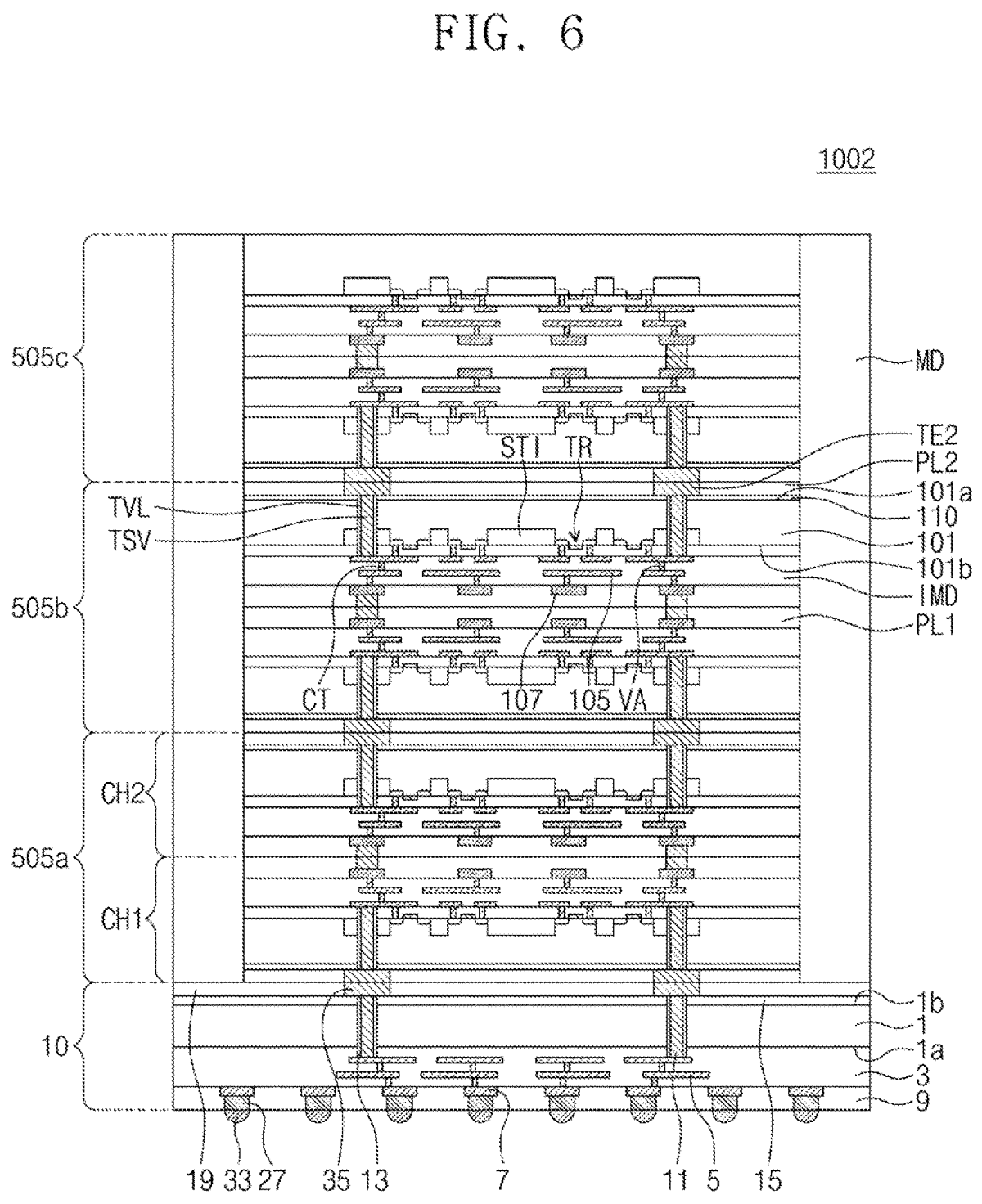

FIG. 6 illustrates a cross-sectional view showing a semiconductor package according to an embodiment.

Referring to FIG. 6, a semiconductor package 1000 according to the present embodiment may include first semiconductor chip 505a, second semiconductor chip 505b and third semiconductor chip 505c sequentially stacked on a buffer die 10. The buffer die 10 may be an interposer or a logic circuit chip.

Each of the first to third semiconductor chips 505a to 505c may have the same structure as that of the semiconductor chip 505 discussed with reference to FIG. 4. However, the third semiconductor chip 500c at a top position may not have any of the through via TSV, the via dielectric layer TVL, the protection layer 110, the second passivation layer PL2, and the third conductive pad TE2.

A mold layer MD may be formed on a top surface of the buffer die 10 and lateral surfaces of the first to third semiconductor chips 505a to 505c. For example, the mold layer MD may cover the top surface of the buffer die 10 and lateral surfaces of the first to third semiconductor chips 505*a* to 505*c*. A top surface of the mold layer MD may be coplanar with the first surface 101*a* of the semiconductor substrate 101 included in the second sub-chip CH2 of the third semiconductor chip 505*c*. Other structural features may be identical or similar to those discussed with reference to FIG. 3A.

In a semiconductor chip according to some embodiments, because a wiring section is positioned at a central portion of the semiconductor chip, and because a connection structure is disposed on upper and lower sides of the wiring section, it may be possible to prevent or minimize a variation in surface height of a wafer structure in the middle of fabricating the semiconductor chip. Accordingly, there may be an increase in reliability of a semiconductor chip and a second package that are finally fabricated.

Moreover, in a method of fabricating a semiconductor chip according to embodiments, before a back grinding process is performed, a first passivation layer may be formed to have a large thickness or first and second wafer structures may be bonded to allow the wiring section to separate at a sufficient distance from an adhesion layer of a carrier substrate. Therefore, the wafer structure may be prevented or minimized from topography degradation caused by physical stress occurring in the back grinding process. As a result, in embodiments, process failure may be reduced to increase a yield.

While aspects of example embodiments have been particularly shown and described, it will be understood that various changes in form and details may be made therein without departing from the spirit and scope of the following claims.

What is claimed is:

1. A semiconductor chip, comprising:

a semiconductor substrate having a first surface and a second surface that are opposite to each other;

at least one transistor on the first surface;

a first interlayer dielectric layer on the transistor;

a second interlayer dielectric layer on the first interlayer dielectric layer;

at least one wiring line in the second interlayer dielectric layer;

a first conductive pad on the second interlayer dielectric layer;

a first passivation layer on the second interlayer dielectric layer and the first conductive pad;

a second conductive pad in the first passivation layer and connected to the first conductive pad;

a through via that penetrates the semiconductor substrate and the first interlayer dielectric layer and connects with the wiring line;

a second passivation layer on the second surface; and a third conductive pad in the second passivation layer and connected to the through via, wherein the first passivation layer has a first thickness, and wherein the first thickness is from about 0.4 times to about 0.6 times a second thickness between the first surface and a top surface of the second passivation layer.

2. The semiconductor chip of claim 1, wherein the second passivation layer has a third thickness, and wherein the first thickness is greater than the third thickness.

3. The semiconductor chip of claim 1, wherein the second conductive pad comprises:

a pad part having a first width and a bottom surface coplanar with a bottom surface of the first passivation layer; and a via part having a second width less than the first width of the pad part and penetrates the first passivation layer.

4. The semiconductor chip of claim 3, wherein the second conductive pad further comprises a middle connection part between the pad part and the via part, the middle connection part having a third width, and wherein the third width is greater than the first width and less than the second width.

5. The semiconductor chip of claim 1, wherein the wiring line is provided in plural, and at least one of the wiring lines is at a same level as a center of the semiconductor chip.

6. The semiconductor chip of claim 1, wherein the second conductive pad has a first width and a first height, and wherein the first height is greater than the first width.

7. The semiconductor chip of claim 1, further comprising a fourth conductive pad on the second interlayer dielectric layer and in the first passivation layer, wherein a bottom surface of the first passivation layer comprises:

a first area that overlaps the first conductive pad; and a second area that overlaps a position between the first conductive pad and the fourth conductive pad, and wherein the first area is more recessed than the second area toward the semiconductor substrate.

8. A semiconductor chip, comprising a first sub-chip and a second sub-chip bonded to the first sub-chip, wherein each of the first sub-chip and the second sub-chip comprises:

a semiconductor substrate having a first surface and a second surface that are opposite to each other;

at least one transistor on the first surface;

a first interlayer dielectric layer on the transistor;

a second interlayer dielectric layer on the first interlayer dielectric layer;

at least one wiring line in the second interlayer dielectric layer;

a first conductive pad on the second interlayer dielectric layer;

a first passivation layer on the second interlayer dielectric layer and the first conductive pad;

a second conductive pad in the first passivation layer and connected to the first conductive pad;

a through via that penetrates the semiconductor substrate and the first interlayer dielectric layer to connect with the wiring line;

a second passivation layer on the second surface; and a third conductive pad disposed in the second passivation layer and connected to the through via, wherein the first passivation layer of the first sub-chip contacts the first passivation layer of the second sub-chip, and wherein the second conductive pad of the first sub-chip contacts the second conductive pad of the second sub-chip.

9. The semiconductor chip of claim 8, wherein the first sub-chip and the second sub-chip are symmetrical to each other, wherein the second passivation layer of the first sub-chip and the second passivation layer of the second sub-chip have the same thickness, and wherein the semiconductor substrate of the first sub-chip and the semiconductor substrate of the second sub-chip have the same thickness.

10. The semiconductor chip of claim 8, wherein the through via of the first sub-chip overlaps the through via of the second sub-chip in a vertical direction.

11. A semiconductor package, comprising:

a buffer die;

a plurality of semiconductor chips stacked on the buffer die; and a mold layer on a top surface of the buffer die and lateral surfaces of the plurality of semiconductor chips, wherein each of the plurality of semiconductor chips comprises:

a first wiring section comprising multi-layered wiring lines;

a lower connection structure below the first wiring section, the lower connection structure comprising a lower via and a lower conductive pad; and an upper connection structure on the first wiring section, the upper connection structure comprising an upper via and an upper conductive pad, wherein the first wiring section is at a level the same as a level of a center of the semiconductor chip, wherein a bottom surface of the lower conductive pad is at a level the same as a level of a bottom surface of the semiconductor chip, and wherein a top surface of the upper connection structure is at a level the same as a level of a top surface of the semiconductor chip.

12. The semiconductor package of claim 11, wherein the lower connection structure further comprises a first passivation layer on a bottom surface of the first wiring section and has a first thickness, the lower via and the lower conductive pad being in the first passivation layer, wherein the upper connection structure further comprises:

a first semiconductor substrate on a top surface of the first wiring section, the upper via penetrating the first semiconductor substrate; and a second passivation layer on a top surface of the first semiconductor substrate, the upper conductive pad being in the second passivation layer, and wherein the first thickness is from about 0.4 times to about 0.6 times a second thickness between a top surface of the second passivation layer and a bottom surface of the first semiconductor substrate.

13. The semiconductor package of claim 12, wherein the second passivation layer has a third thickness, and wherein the first thickness is greater than the third thickness.

14. The semiconductor package of claim 12, wherein the lower via has a first width and a first height, and wherein the first height is greater than the first width.

15. The semiconductor package of claim 12, wherein the lower connection structure further comprises a plurality of internal conductive pads on the bottom surface of the first wiring section, the plurality of internal conductive pads in the first passivation layer, wherein a bottom surface of the first passivation layer comprises:

first areas that overlap the plurality of internal conductive pads; and a second area that overlaps a position between the plurality of internal conductive pads, and wherein the first areas are more recessed than the second area toward the plurality of internal conductive pads.

16. The semiconductor package of claim 12, further comprising an uppermost semiconductor chip of the plurality of semiconductor chips, wherein the uppermost semiconductor chip comprises:

a second semiconductor substrate having a fourth thickness;

a second wiring section below the second semiconductor substrate; and a third passivation layer below the second wiring section, wherein the first semiconductor substrate has a fifth thickness less than the first thickness.

17. The semiconductor package of claim 11, wherein the lower connection structure further comprises:

a first semiconductor substrate on a bottom surface of the first wiring section, the lower via penetrating the first semiconductor substrate; and a first passivation layer on a bottom surface of the first semiconductor substrate, the lower conductive pad disposed in the first passivation layer, and wherein the upper connection structure comprises:

a second semiconductor substrate on a top surface of the first wiring section, the upper via penetrating the second semiconductor substrate; and a second passivation layer on a top surface of the second semiconductor substrate, the upper conductive pad disposed in the second passivation layer.

18. The semiconductor package of claim 17, wherein the first wiring section comprises:

a first interlayer dielectric layer on the lower connection structure;

first wiring lines stacked in the first interlayer dielectric layer;

a first interface dielectric layer on the first interlayer dielectric layer;

a first internal conductive pad and a first connection conductive pattern in the first interface dielectric layer;

a second interface dielectric layer on the first interface dielectric layer;

a second internal conductive pad and a second connection conductive pattern in the second interface dielectric layer;

a second interlayer dielectric layer on the second interface dielectric layer; and second wiring lines stacked in the second interlayer dielectric layer, wherein the first connection conductive pattern contacts the second connection conductive pattern, and wherein the first interface dielectric layer contacts the second interface dielectric layer.

19. The semiconductor package of claim 18, wherein the first wiring lines have a symmetrical shape with respect to the second wiring lines.

20. The semiconductor package of claim 11, wherein the lower via overlaps the upper via in a vertical direction.

* * * * *